United States Patent
Honsho et al.

(10) Patent No.: US 10,381,249 B2
(45) Date of Patent: Aug. 13, 2019

(54) SUBSTRATE CONTAINER, LOAD PORT APPARATUS, AND SUBSTRATE TREATING APPARATUS

(71) Applicant: SCREEN Holdings Co., Ltd., Kyoto (JP)

(72) Inventors: Kazuhiro Honsho, Kyoto (JP); Mitsukazu Takahashi, Kyoto (JP); Akito Hatano, Kyoto (JP); Koji Hashimoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 217 days.

(21) Appl. No.: 15/512,317

(22) PCT Filed: Jul. 28, 2015

(86) PCT No.: PCT/JP2015/071409
§ 371 (c)(1),
(2) Date: Mar. 17, 2017

(87) PCT Pub. No.: WO2016/051944
PCT Pub. Date: Apr. 7, 2016

(65) Prior Publication Data
US 2017/0294328 A1    Oct. 12, 2017

(30) Foreign Application Priority Data

Sep. 29, 2014   (JP) .................. 2014-198697

(51) Int. Cl.
*H01L 21/673*   (2006.01)
*H01L 21/677*   (2006.01)
*B65D 85/00*   (2006.01)

(52) U.S. Cl.
CPC .. *H01L 21/67386* (2013.01); *H01L 21/67369* (2013.01); *H01L 21/67376* (2013.01);
(Continued)

(58) Field of Classification Search
CPC .................. H01L 21/67369; H01L 21/67383
See application file for complete search history.

(56) References Cited

U.S. PATENT DOCUMENTS 4,043,451 A * 8/1977 Johnson ............... B65D 25/107
                                                    206/454
5,228,568 A * 7/1993 Ogino ............... H01L 21/67369
                                                    206/587

(Continued)

FOREIGN PATENT DOCUMENTS

JP    2005-518318 A    6/2005
JP    2006-120791 A    5/2006

(Continued)

OTHER PUBLICATIONS

International Search Report dated Oct. 20, 2015 in corresponding PCT International Application No. PCT/JP2015/071409.

(Continued)

*Primary Examiner* — Jonathan Snelting
(74) *Attorney, Agent, or Firm* — Ostrolenk Faber LLP

(57) ABSTRACT

A substrate container includes a casing, a rack, a lid, a lid holder, and a substrate separating mechanism. The casing has on its front face an opening. The substrate separating mechanism has a contact part that directly contacts substrates. The contact part is movable relative to the lid holder. The lid moves forward to the opening, and the contact part moves backward relative to the lid holder, whereby the lid holder holds ends of the substrates. The lid moves backward from the opening, and the contact part moves forward to the lid holder, whereby the substrate separating mechanism separates the substrates from the lid holder.

10 Claims, 8 Drawing Sheets

(52) U.S. Cl.
CPC .. *H01L 21/67383* (2013.01); *H01L 21/67772* (2013.01); *B65D 85/00* (2013.01)

(56) References Cited

U.S. PATENT DOCUMENTS

| | | | | |
|---|---|---|---|---|
| 6,267,245 | B1 * | 7/2001 | Bores | H01L 21/67369 206/454 |
| 6,644,477 | B2 * | 11/2003 | Bores | H01L 21/67369 206/454 |
| 7,017,749 | B2 * | 3/2006 | Yajima | H01L 21/67369 206/454 |
| 7,344,031 | B2 * | 3/2008 | Hasegawa | H01L 21/67369 206/454 |
| 7,967,147 | B2 * | 6/2011 | Mimura | H01L 21/67369 206/454 |
| 8,118,169 | B2 * | 2/2012 | Hosoi | H01L 21/67369 206/454 |
| 8,453,842 | B2 * | 6/2013 | Inoue | H01L 21/67386 206/454 |
| 9,627,238 | B2 * | 4/2017 | Morikawa | H01L 21/67265 |
| 2003/0159971 | A1 | 8/2003 | Bores et al. | 206/711 |
| 2011/0000817 | A1 | 1/2011 | Hosoi et al. | 206/710 |
| 2014/0178162 | A1 | 6/2014 | Morikawa et al. | 414/416.08 |

FOREIGN PATENT DOCUMENTS

| | | |
|---|---|---|
| JP | 2009-049096 A | 3/2009 |
| JP | 2014-143388 A | 8/2014 |
| WO | WO 2009/131016 A1 | 10/2009 |

OTHER PUBLICATIONS

Written Opinion dated Oct. 20, 2015 in corresponding PCT International Application No. PCT/TP2015/071409.

* cited by examiner

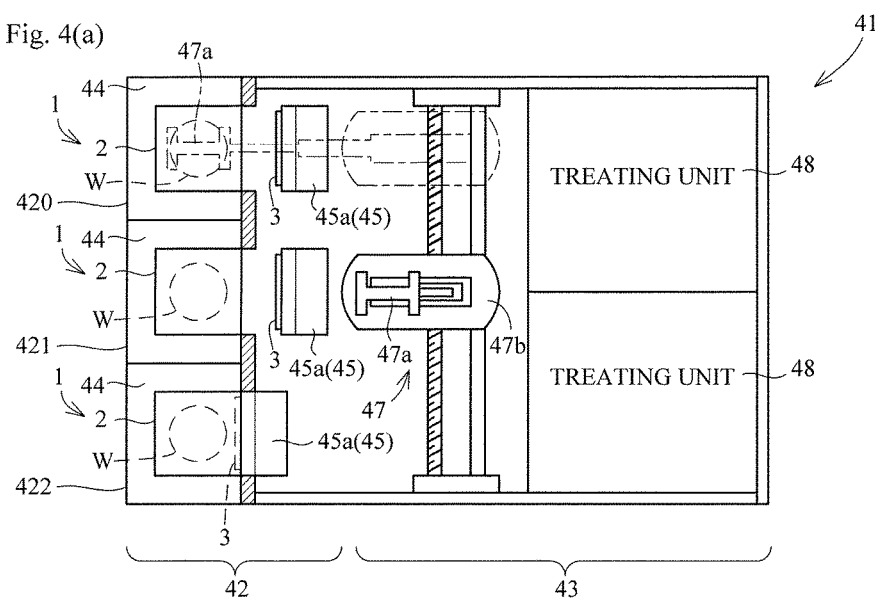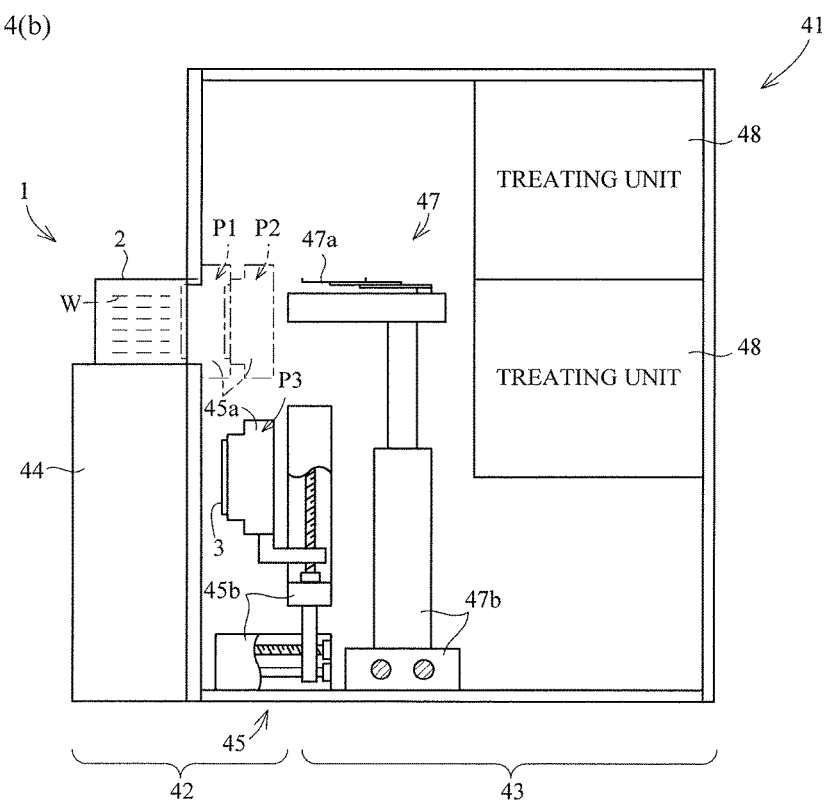

SUBSTRATE CONTAINER, LOAD PORT APPARATUS, AND SUBSTRATE TREATING APPARATUS

CROSS-REFERENCE TO RELATED APPLICATIONS

The present application is a 35 U.S.C. §§ 371 national phase conversion of PCT/JP2015/071409, filed Jul. 28, 2015, which claims priority to Japanese Patent Application No. 2014-198697, filed Sep. 29, 2014, the contents of both of which are incorporated herein by reference. The PCT International Application was published in the Japanese language.

TECHNICAL FIELD

The present invention relates to a substrate container that accommodates a semiconductor wafer, a glass substrate for a photomask, a glass substrate for a liquid crystal display, an optical disk substrate, and the like (hereinafter, simply referred to as a "substrate") as well as a load port apparatus and a substrate treating apparatus applicable thereto.

BACKGROUND ART

A currently-used substrate container includes a casing and a lid. When the lid is detached from the casing, substrates within the casing may be moved away from or fall out of a suitable position or area (e.g., a transportation position). Hereinafter, such phenomenon is called as a "positional deviation" as appropriately.

The positional deviation causes difficulty in suitable transportation of the substrates from the casing. In such a case, the lid is temporally attached to the casing, and then is detached from the lid. When the substrates are disposed at the suitable position or area, the substrates are transported from the casing.

Patent Literature 1: Japanese Patent Publication No. 2009-49096A

SUMMARY OF INVENTION

Technical Problem

However, the example of the currently-used apparatus with such constructions has the following problems. Specifically, the substrate positional deviation may occur continuously even with repeated attachment and detachment of the lid, leading to impossibility of suppressing the substrate positional deviation accurately. Moreover, the repeated attachment and detachment of the lid may cause delayed substrate treatment to produce decreased throughput.

The present invention has been made regarding the state of the art noted above, and its one object is to provide a substrate container, a load port apparatus, and a substrate treating apparatus that allow suitable control of a substrate position upon detachment of a lid from a casing.

Solution to Problem

The present invention is constituted as stated below to achieve the above object. One aspect of the present invention provides a substrate container. The substrate container includes a casing with an opening on its front face that accommodates substrates therein, a rack inside the casing on which the substrates are disposed in a substantially horizontal attitude, a lid that is attached/detached to/from the casing and opens/closes the opening, a lid holder attached to a rear face of the lid that holds ends of the substrates, and a substrate separating mechanism attached to the rear face of the lid that separates from the lid holder the substrates held with the lid holder. The substrate separating mechanism includes a contact part that directly contacts the substrates. The contact part is movable relative to the lid holder. The lid moves forward to the opening, and the contact part moves backward relative to the lid holder, whereby the lid holder holds the ends of the substrates. The lid moves backward from the opening, and the contact part moves forward relative to the lid holder, whereby the substrate separating mechanism separates the substrates from the lid holder.

[Operation and Effect] When the lid moves forward to the opening, the contact part moves backward relative to the lid holder. Accordingly, the lid is attached to the casing, and the lid holder holds each end of the substrates. The substrate separating mechanism does not prevent the lid holder from holding the substrates. Consequently, the lid holder achieves suitable holding of the substrates. As a result, the substrates are suitably protectable with the lid attached to the casing.

When the lid moves backward from the opening, the contact part moves forward relative to the lid holder. Accordingly, the lid is detached from the casing, and the substrate separating mechanism separates the substrates from the lid holder. As a result, detachment of the lid from the casing allows suitable control in position of the substrates within the casing.

Here, the contact part may be disposed behind the lid holder when "the contact part moves backward relative to the lid holder", but otherwise is also applicable. That is, the condition that "the contact part moves backward relative to the lid holder" defines relative movement between the contact part and the lid holder, and thus does not define the position of the contact part relative to the lid holder. Likewise, the contact part may be disposed in front of the lid holder when "the contact part moves forward relative to the lid holder", but otherwise is also applicable.

Here, the substrate separating mechanism may separate from the lid holder all the substrates held with the lid holder while the lid is attached to the casing. Alternatively, the substrate separating mechanism may separate from the lid holder only the substrate that does not separate from the lid holder by itself when the lid moves backward from the opening. In other words, the substrate separating mechanism may separate from the lid holder the substrate that separates by itself from the lid holder when the lid moves backward from the opening. Alternatively, the substrate separating mechanism may separate from the lid holder both the substrate separating by itself from the lid holder and the substrate not separating by itself from the lid holder when the lid moves backward from the opening.

It is preferred in the aspect of the present invention that the contact part moves close to the lid, whereby the contact part moves backward relative to the lid holder, and the contact part moves away from the lid, whereby the contact part moves forward relative to the lid holder. This allows the contact part to move forward and backward suitably relative to the lid holder.

It is preferred in the aspect of the present invention that the contact part continuously contacts the substrates until at least the substrates separate from the lid holder when the lid moves backward from the opening. Accordingly, the substrate separating mechanism ensures separation of the substrates from the lid holder.

It is preferred in the aspect of the present invention that the substrate separating mechanism includes an elastic member that moves the contact part, and that elastic deformation of the elastic member causes the contact part to move backward relative to the lid holder, and restoration of the elastic member causes the contact part to move forward relative to the lid holder. In other words, the contact part moves backward relative to the lid holder, whereby the elastic member elasticity deforms to press the contact part relative to the lid holder in a forward direction. The elastic member as above allows suitable forward/backward movement of the contact part relative to the lid holder. Moreover, the elastic member achieves a simplified configuration of the substrate separating mechanism.

It is preferred in the aspect of the present invention that the substrates within the casing move the contact part backward relative to the lid holder through contact to the contact part when the lid moves forward to the opening. Here, backward movement of the contact part relative to the lid holder with use of the substrate achieves a simplified configuration of the substrate container.

It is preferred that the aspect of the present invention further includes a stopper provided in the casing for restricting forward movement of the contact part from a given position within the casing through contact to the substrate separating mechanism. This allows prevention of the contact part from excessively moving forward within the casing. Consequently, the substrates within the casing are suitably protectable.

It is preferred in the aspect of the present invention that the given position is set as a position where the stopper contacts the ends of the substrates held with the lid holder when the lid is attached to the casing, or is set adjacent to the ends of the substrates held with the lid holder when the lid is attached to the casing. When the lid is attached to the casing, the substrate separating mechanism applies no unnecessary force to the substrates, leading to no damage to the substrates.

It is preferred that the aspect of the present invention further includes a casing holder provided in the casing for holding the ends of the substrates, and that the casing holder and the lid holder nip the ends of the substrates. The casing holder and the lid holder allow suitable holding of the substrates while the lid is attached to the casing. Here, when the casing holder and the lid holder hold the substrates, undersurfaces of the substrates may contact the rack, but otherwise is applicable.

It is preferred in the aspect of the present invention that the ends of the substrates are nipped with the casing holder and the lid holder, whereby the substrates are moved upward from the rack, and that, when the lid holder moves backward from the opening and the contact part moves forward relative to the lid holder, the substrate separating mechanism separate the substrates from the lid holder and moves the substrates downward from the lid holder to the rack. The substrate separating mechanism separates the substrates from the lid holder when the lid holder moves backward from the opening and the contact part moves forward relative to the lid holder. This ensures downward movement of the substrates from the lid holder to the rack.

Another aspect of the present invention provides a load port apparatus including a mount table on which the substrate container mentioned above is placeable, and an open/close mechanism that opens/closes the lid of the substrate container on the mount table.

[Operation and Effect] The load port apparatus according to the other aspect of the present invention allows suitable placement of the substrate container mentioned above.

Another aspect of the present invention provides a substrate treating apparatus including a mount table on which the substrate container mentioned above is placeable, an open/close mechanism that opens/closes the lid of the substrate container on the mount table, a treating unit that treats substrates, and a transport mechanism that transports the substrates from the substrate container on the mount table to the treating unit.

[Operation and Effect] The other aspect of the present invention allows treatment to the substrates that are accommodated in the substrate container mentioned above.

Advantageous Effects of Invention

With the substrate container, the load port apparatus, and the substrate treating apparatus according to the aspects of the present invention, the substrates are suitably protectable while the lid is attached to the casing, leading to suitable transportation of the substrate container. Moreover, detachment of the lid from the casing allows suitable control in position of the substrates within the casing. Accordingly, the substrates are suitably transported from the casing.

BRIEF DESCRIPTION OF DRAWINGS

FIG. 4(a) is a plan view of a substrate treating apparatus, and FIG. 4(b) is a side view of the substrate treating apparatus.

EMBODIMENT 1

1. Configuration of Substrate Container

Figure 1A:
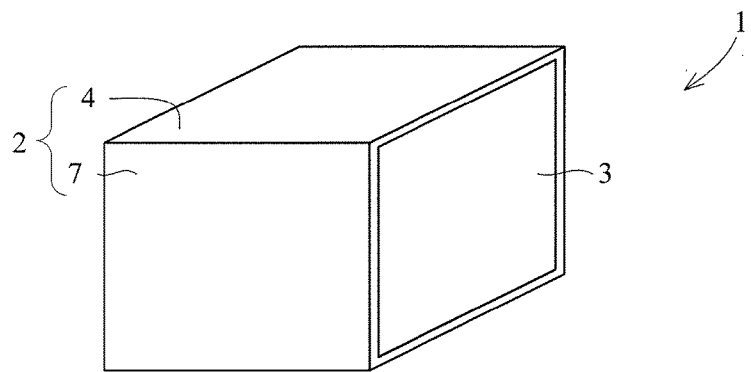
FIG. 1(a) is a perspective view of an external appearance of a substrate container with a lid attached to a casing.
Figure 1B:
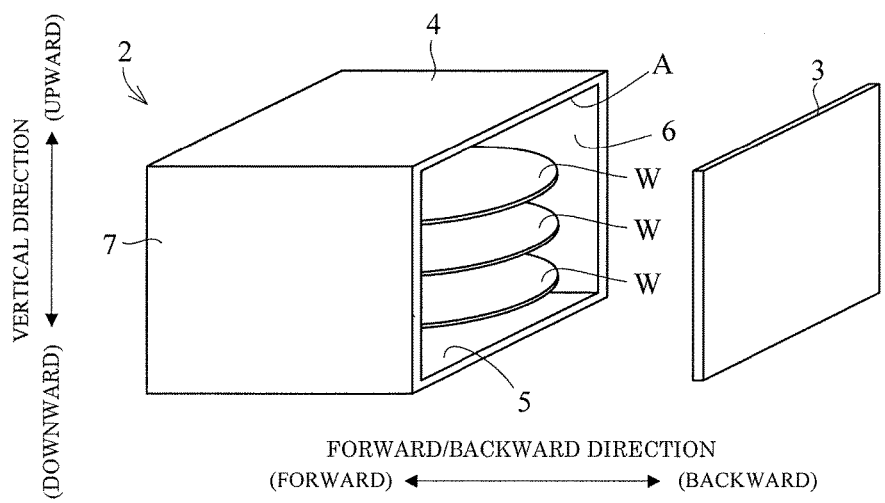
FIG. 1(b) is a perspective view of an external appearance of a substrate container with a lid not attached to a casing.

Reference is made to FIGS. 1(a) and 1(b). A substrate container 1 has an outer shape of a substantially rectangular solid. The substrate container 1 allows accommodation of a plurality of substrates W. Here, examples of the "substrate W" include a semiconductor wafer, a glass substrate for a photomask, a glass substrate for a liquid crystal display, a substrate for plasma display, an optical disk substrate, a magnetic disc substrate, and an optical magnetic disc substrate.

The substrate container 1 includes a casing 2 and a lid 3. The lid 3 is attached to a front face of the casing 2. As illustrated in FIG. 1(b), the casing 2 includes an opening A at the front face thereof. The lid 3 opens/closes the opening A. The opening A is a virtual plane in a substantially vertical direction. When the lid 3 is attached/detached to/from the casing 2, the lid 3 moves in a forward/backward direction that is substantially orthogonal relative to the opening A while the lid 3 faces to the opening A. Here, the forward/backward direction is substantially horizontal. The casing 2 includes therein a space S (see FIG. 2) for accommodating the substrates W. The substrate container 1 is able to accommodate at least one of the substrates W. The substrate container 1 typically accommodates twenty-five substrates W. Hereinafter, the substrate container 1 that is able to accommodate a maximum of three substrates W is to be described as one example for convenience.

Figure 2A:
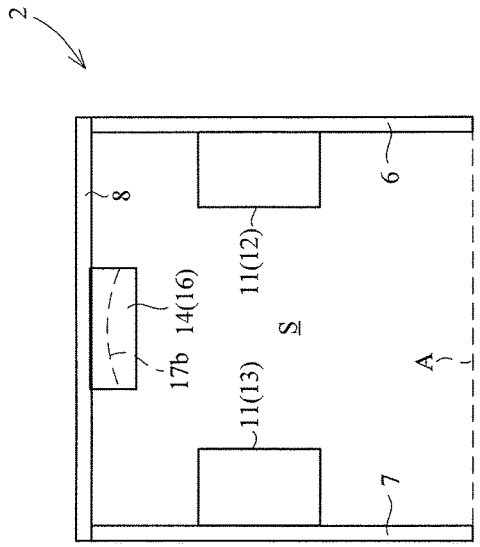
FIG. 2(a) is a plan view of an interior of the casing.
Figure 2C:
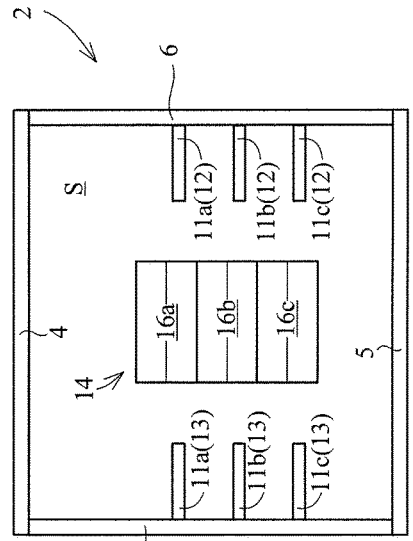
FIG. 2(c) is a front view of the interior of the casing.
Figure 2B:
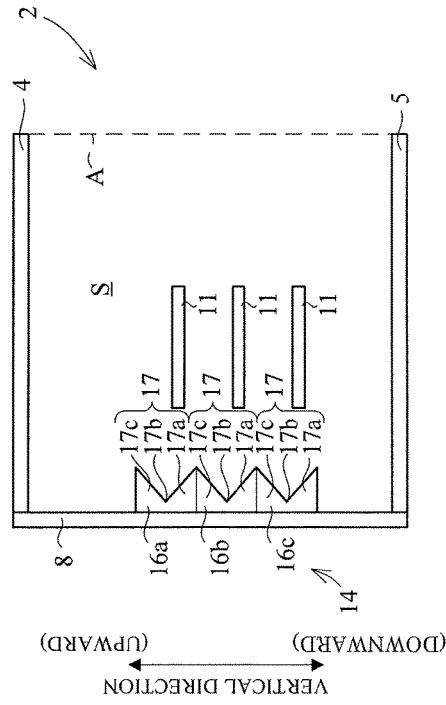
FIG. 2(b) is a side view of the interior of the casing.

Reference is made to FIGS. 2(a) to 2(c) in addition to FIGS. 1(a) and 1(b). The casing 2 includes a top plate 4, a bottom plate 5, a right wall 6, a left wall 7, and a rear wall 8. The elements 4 to 8 define the space S. FIG. 2(a) abbreviates the top plate 4 and the bottom plate 5 for convenience. FIG. 2(b) abbreviates the right wall 6 and the left wall 7. FIG. 2(c) abbreviates the rear wall 8.

The casing 2 includes therein racks 11a, 11b, and 11c. The racks 11a, 11b, and 11c are disposed in vertical direction to be one above the other. The racks 11a, 11b, and 11c each have one substrate W placed thereon. The racks 11a, 11b, 11c each support the substrate W in a substantially horizontal attitude from a lower side thereof. The racks 11a, 11b, and 11c each contact only an undersurface of the substrate W. In the present specification, the "undersurface of the substrate W" conceptually includes a lower periphery of the substrate W. Hereinafter, the racks 11a, 11b, and 11c are simply referred to as a "rack 11" when they are not particularly distinguished. As is to be mentioned later, a holding arm 47a is disposed on the exterior of the substrate container 1 for transporting the substrate W into and from the rack 11. When transporting the substrate W into the rack 11, the holding arm 47a enters a position above the rack 11 and slightly moves downward, thereby placing the substrate W on the rack 11. When transporting the substrate W out of the rack 11, the holding arm 47a enters a position below the rack 11 and slightly moves upward, thereby holding the substrate W on the rack 11 (see FIGS. 4(a) and 4(b)). Accordingly, a clearance is provided above and below the rack 11 through which the holding arm 47a is able to enter safely (for instance, the holding arm 47a is able to enter with no collision against the substrate W and the rack 11). Moreover, the rack 11 is disposed at a preset gap in the vertical direction so as for the holding arm 47a to enter safely.

In the present embodiment, the rack 11 includes a right rack 12 and a left rack 13. The right rack 12 is spaced away from the left rack 13. The right rack 12 protrudes from the right wall 6, whereas the left rack 13 protrudes from the left wall 7.

The casing 2 includes therein a casing holder block 14. The casing holder block 14 is connected to the casing 2 (rear wall 8). The casing holder block 14 has casing holders 16a, 16b, and 16c formed therein. The casing holders 16a, 16b, and 16c are disposed in the vertical direction to be one above the other. The casing holders 16a, 16b, and 16c each holds the end of the substrate W. Hereinafter, the casing holds 16a, 16b, and 16c are simply referred to as a "casing holder 16" when they are not particularly distinguished.

The casing holder 16 is made of resin, for example. The casing holder 16 has a groove 17 formed therein respectively. As illustrated in FIG. 2(b), the groove 17 is recessed backward. The groove 17 has a substantially "V" shape, for example, in side view.

The groove 17 includes a downward slope 17a, a deepest part 17b, and an upward slope 17c. The downward slope 17a adjoins to a lower part of the deepest part 17b, and the upward slope 17c adjoins to an upper part of the deepest part 17b.

Figure 3A:
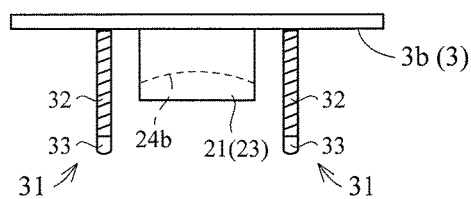
FIG. 3(a) is a plan view of the lid.
Figure 3B:
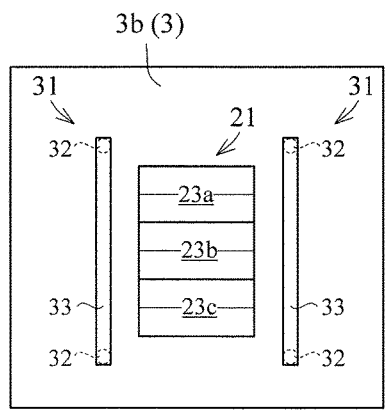
FIG. 3(b) is a rear view of the lid.
Figure 3C:
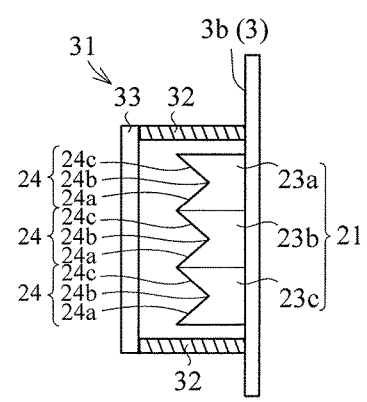
FIG. 3(c) is a side view of the lid.

Reference is made to FIGS. 3(a) and 3(b). A face of the lid 3 contacting the interior of the casing 2 (e.g., the space S) while the lid 3 is attached to the casing 2 is called a "rear face 3b". A lid holder block 21 is fixed on the rear face 3b. The lid holder block 21 has lid holders 23a, 23b, and 23c formed therein. The lid holders 23a, 23b, and 23c are disposed in the vertical direction to be one above the other. The lid holders 23a, 23b, and 23c each hold the end of the substrate W. Hereinafter, the lid holders 23a, 23b, and 23c are simply referred to as a "lid bolder 23" when they are not particularly distinguished.

The lid holder 23 is made of resin, for example. The lid holder 23 is preferably made of an elastic resin. The lid holder 23 has the same shape as that of the casing holder 16. That is, the lid holder 23 has a groove 24 formed therein respectively. The groove 24 includes a downward slope 24a, a deepest part 24b, and an upward slope 24c.

Figure 5A:
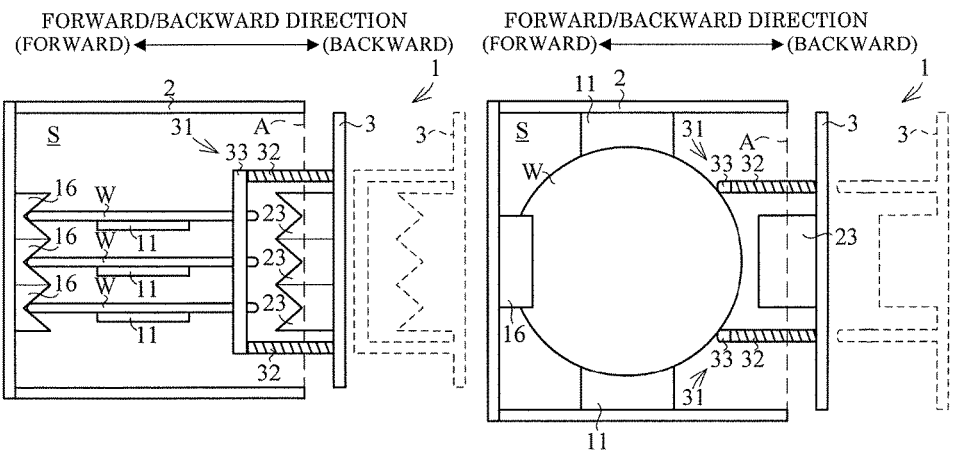
FIGS. 5(a) to 5(c) are each a side view and a plan view of an interior of the substrate container when the lid is attached/detached to/from the casing.
Figure 5B:
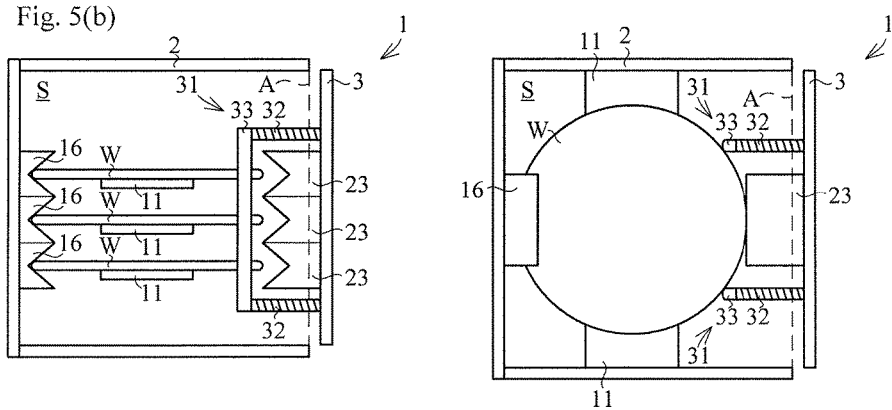
Figure 5C:
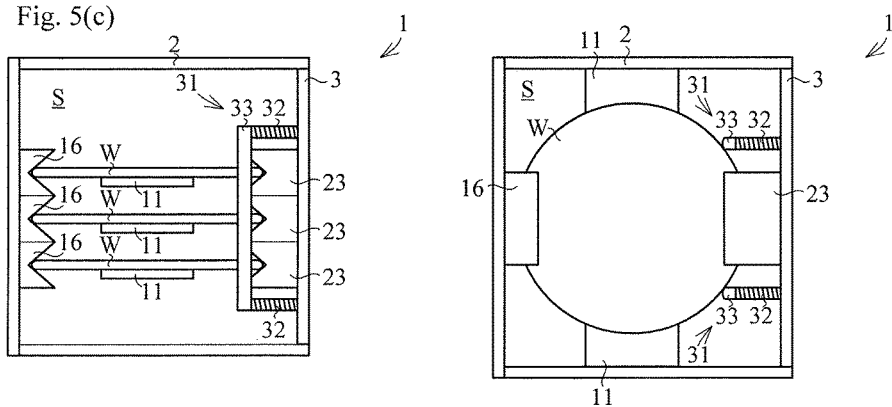

Reference is made to FIGS. 5(a) to 5(c). When the lid 3 faces to the opening A, the deepest part 17b of the casing holder 16a and the deepest part 24b of the lid holder 23a are set at a level substantially equal to that of the end of the substrate W placed on the rack 11a substantially horizontally. This is similarly applicable to a relationship in level between the holders 16b and 23b and the rack 11b and that between the holders 16c and 23c and the rack 11c.

Reference is again made to FIGS. 3(a) and 3(b). The lid 3 has a substrate separating mechanism 31 attached thereto. The substrate separating mechanism 31 separates the substrate W held with the lid holder 23 from the lid holder 23. The substrate separating mechanism 31 includes a plurality of (e.g., four) springs 32 and a plurality of (e.g., two) contact parts 33.

The springs 32 hold the contact parts 33 so as to move relative to the lid 3. The springs 32 are each, for example, a compression coil spring. The springs 32 are disposed between the lid 3 and the contact parts 33. The springs 32 each have a first end connected to the rear face 3b of the lid 3. The two springs 32 are disposed in the vertical direction to be one above the other on a right side of the lid holder 23. The two springs 32 each have a second end connected to one of the contact parts 33. The other two springs 32 are disposed in the vertical direction to be one above the other on the left side of the lid holder 23. The other two spring 32 each have a second end connected to the other of the contact parts 33. The springs 32 correspond to the elastic member in the present invention.

One of the contact parts 33 is disposed on the right side of the lid holder 23, whereas the other of the contact parts 33 are disposed on the left of the lid holder 23. The contact parts 33 extend in the vertical direction, and allow contact of the substrates W in the casing 2 collectively. The springs 32 deforms, whereby the contact parts 33 allow movement in the forward/backward direction relative to the lid holder 23. In other words, when the contact parts 33 approach the lid 3, the springs 32 deform compressively to press in a direction where the contact parts 33 move away from the lid 3.

In the specification, of the forward/backward directions, a direction that is from the opening A to the rear wall 8 is referred to as a "forward direction", and a direction opposite to the forward direction is referred to as a "backward direction". The forward direction corresponds to a direction that the elements, such as the lid 3, the lid holder 23 and the contact parts 33, that are provided externally of the casing 2 approach the opening A. In contrast to this, the backward direction corresponds to a direction where the elements provided externally of the casing 2 move away from the opening A. In the specification, "moving forward" appropriately means that the elements provided externally of the casing 2 move forward. Moreover, "moving backward" appropriately means that the elements provided externally of the casing 2 move backward.

2. Configuration of Load Port Device and Substrate Treating Apparatus

The following describes a substrate treating apparatus 41 to which the substrate container 1 is applicable with reference to FIGS. 4(*a*) and 4(*b*). The substrate treating apparatus 41 includes a load port section 42 and a treating section 43. The load port section 42 includes a plurality of load port devices 420, 421, and 422. The load port devices 420, 421, and 420 each include a mount table 44 and an open/close mechanism 45. The substrate container 1 is placed on the mount table 44. The open/close mechanism 45 opens/closes the substrate container 1 placed on the mount table 44. The open/close mechanism 45 includes a shutter 45*a* and a shutter drive mechanism 45*b*. The shutter 45*a* attaches/detaches the lid 3 of the substrate container 1 on the mount table 44, and holds the lid 3 detached from the substrate container 1. When the lid open/close mechanism 45 detaches the lid 3, the shutter drive mechanism 45*b* moves the shutter 45*a* to positions P1, P2, and P3 (see FIG. 4(*b*)). When the shutter 45*a* moves between the position P1 and position P2, the shutter 45*a* allows the lid 3 to move in the forward/backward direction while the lid 3 faces to the opening A. Here, the load port devices 420, 421, and 422 correspond to the load port apparatus in the present invention.

The treating section 43 includes a transport mechanism 47 and a treating unit 48. The transport mechanism 47 conveys the substrates W. The transport mechanism 47 accesses the substrate container 1 on the mount table 44. The transport mechanism 47 also accesses the treating unit 48. The transport mechanism 47 includes a holding arm 47*a* that holds the substrates W and a holding arm drive mechanism 47*b* that moves the holding arm 47*a*. The treating unit 48 performs treatment, such as cleaning, to the substrates W.

3. Example of Operation

The following describes one example of operation of the substrate container 1 according to Embodiment 1. Hereunder, a condition is to be firstly described where the lid 3 is detached from the casing 2. Then, an example of operation to attach the lid 3 to the casing 2 and one to detach the lid 3 from the casing 2 are to be described. Finally, an example of operation to transport the substrate W from the substrate container 1 is to be described briefly.

3.1. Condition of Lid 3 Detached from Casing 2

Reference is made to FIGS. 4(*a*) and 4(*b*). The substrate container 1 is placed on the mount table 44. The lid 3 is detached from the casing 2, and thus the substrate container 1 is opened. The shutter 45*a* holds the lid 3 at the position P2 or the position P3, for example.

The following describes in more detail with reference to FIG. 5(*a*). FIGS. 5(*a*), 5(*b*), and 5(*c*) each illustrate a side view on the left thereof and a plan view on the right thereof. For instance, the lid 3 is disposed at a position denoted by dotted lines where the lid 3 is detached from the casing 2. The lid holder 23 and the contact parts 33 are spaced away from the substrate W. No spring 32 elastically deforms, and thus the springs 32 hold the contact parts 33 by their natural lengths. Within the casing 2, the substrates W are each placed on the rack 11 and the ends of each substrate W contact the deepest part 17*b* of the casing holder 16.

3.2. Example of Operation when Lid 3 is Attached to Casing 2

Reference is made to FIG. 4(*b*). The shutter 45*a* moves from the position P2 to the position P1 while holding the lid 3. This causes the lid 3 to be attached to the casing 2. The following describes the above in detail.

Reference is made to FIG. 5(*a*). When the lid 3 moves forward from the position denoted by dotted lines, the lid holder 23 and the substrate separating mechanism 31 moves forward integrally with the lid 3. When the lid 3 reaches a position denoted by solid lines, the contact parts 33 each contact to the end of the substrate W within the casing 2.

Reference is made to FIG. 5(*b*). When the lid 3 moves further forward, reaction force is applied to the contact parts 33 from the substrate W. Accordingly, even when the lid 3 moves forward, the contact parts 33 stop at a position where the contact parts 33 contact the end of the substrate W. Consequently, the contact parts 33 approach the lid 3. In contrast to this, the lid holder 23 moves forward integrally with the lid 3. Accordingly, the contact parts 33 move backward relative to the lid holder 23. When the contact parts 33 move backward relative to the lid holder 23, the contact parts 33 may be disposed in front of the lid holder 23 or behind the lid holder 23. The contact parts 33 move backward relative to the lid holder 23 (i.e., the contact parts 33 approaches to the lid 3), whereby the springs 32 compressively deform. The springs 32 press the contact parts 33 forward, and the contact parts 33 press the substrate W forward (i.e., toward the casing holder 16). The substrate W is pressed against the deepest part 17*b* of the casing holder 16 while the position of the substrate W is not varied.

Reference is made to FIG. 5(*c*). The lid 3 moves forward to the opening A, whereby the lid 3 is attached to the casing 2. At this time, the lid holder 23 moves forward integrally with the lid 3, whereby the deepest part 24*b* of the lid holder 23 contacts the end of the substrate W. The lid holder 23 and the casing holder 16 support the ends of the substrates W so as to sandwich the ends of the substrates W between the lid holder 23 and the casing holder 16 (hereinafter, referred to "nip" appropriately). The casing holder 16, the lid holder 23, and the contact parts 33 contact the substrate W while the lid 3 is attached to the casing 2.

3.3. Example of Operation of Lid 3 Detached from Casing 2

Reference is made to FIG. 4(*b*). The shutter 45*a* moves to the position P1 and holds the lid 3 attached to the casing 2. The shutter 45*a* moves from the position P1 to the position P2 while holding the lid 3. This allows the lid 3 to be detached from the casing 2. The following describes the above in detail.

Reference is made to FIGS. 5(*c*) and 5(*b*). When the lid 3 moves backward from the opening A, the lid holder 23 moves backward integrally with the lid 3. In contrast to this, the springs 32 are restored (i.e., the springs 32 extend), whereby none of the contact parts 33 move backward integrally with the lid 3. The contact parts 33 stand still. Accordingly, the contact parts 33 move away from the lid 3 and forward relative to the lid holder 23. When the contact parts 33 move forward relative to the lid holder 23, the contact parts 33 may be disposed in front of or behind the lid holder 23. Then, the contact parts 33 continuously contact the substrate W even when the lid 3 begins to move backward from the opening A. Accordingly, the contact parts 33 prevent the substrate W from moving backward. More specifically, the contact parts 33 cause the substrate W to remain at a position where the substrate is held while the lid 3 is attached to the casing 2. Then, the contacts parts 33 separate the substrate W from the lid holder 23.

After the substrate W separates from the lid holder 23, the contact parts 33 do not move and thus are at rest until the lid 3 moves backward to a position denoted by solid lines in FIG. 5(a). In other words, the contact parts 33 continuously move forward relative to the lid holder 23 and contact the substrate W until the lid 3 moves backward to the position denoted by solid lines in FIG. 5(a).

When the lid 3 moves further backward from the position denoted by the solid lines in FIG. 5(a), the contact parts 33 begin to move backward integrally with the lid 3 to separate from the substrate W. After the contact parts 33 separate from the substrate W, the substrates W are aligned suitably within the casing 2. Specifically, after the lid 3 is detached from the casing 2, the substrates within the casing 2 are disposed at the same position in the forward/backward direction. Moreover, the substrates W after the lid 3 is detached from the casing 2 are disposed at the same position as that when the lid 3 is attached to the casing 2. In addition, no variation in position of the substrates W occurs every detachment of the lid 3 from the casing 2. That is, the substrates W after the lid 3 is detached from the casing 2 are always disposed at the same position.

3.4. Example of Operation upon Transportation of Substrate W from Substrate Container 1.

Reference is made to FIGS. 4(a) and 4(b). The casing 2 is opened. All the substrates W within the casing 2 are placed in the rack 11 substantially horizontally. The lid 3 and the shutter 45a are disposed at the position P3. The holding arm 47a enters the casing 2. Specifically, the holding arm 47a enters a position below the rack 11 where one substrate W to be transported is placed. Then the holding arm 47a slightly moves upward to cause the one substrate W to float from the rack 11 and then holds the substrate W. Thereafter, the holding arm 47a moves out of the casing 2 while holding the substrate W. In this manner, the transport mechanism 47 transports the substrate W within the substrate container 1. Thereafter, the holding arm 47a transports the substrate W to the treating unit 48.

4. Effect of Embodiment 1

When the lid 3 is attached to the casing 2, the lid 3 moves forward to the opening A. At this time, the contact parts 33 move backward relative to the lid holder 23, whereby the substrate separating mechanism 31 does not prevent the lid holder 23 from holding the substrate W. Accordingly, the lid holder 23 allows suitable holding of the end of the substrate W within the casing 3 while the lid 3 is attached to the casing 2. Consequently, the substrate W is suitably protectable when the substrate container 1 is conveyed while the lid 3 is attached to the casing 2.

When the lid 3 is detached from the casing 2, the lid 3 moves backward from the opening A. At this time, the contact parts 33 move forward relative to the lid holder 23 to separate the substrate W from the lid holder 23. This causes the substrate W to remain at the suitable position or area. For instance, the following is avoidable. That is, the lid 3 is detached from the casing 2 while the substrate W is placed on the lid holder 23, and accordingly the substrate W is pulled out of the casing 2. As noted above, the substrate separating mechanism 31 allows the substrate W to remain at the suitable position within the casing 2 when the lid 3 is detached from the casing 2.

The contact parts 33 are movable relative to the lid 3 in the forward/backward direction. In other words, a distance in the forward/backward direction between the contact parts 33 and the lid 3 is variable. This allows the contact parts 33 to move forward and backward suitably relative to the lid holder 23. The lid holder 23 is fixed on the lid 3. Accordingly, the contact parts 33 allow more suitable forward/backward movement relative to the lid holder 23.

When the lid 3 moves backward from the opening A, the substrate separating mechanism 31 causes the substrate W to remain at the position where the substrate W is held while the lid 3 is attached to the casing 2. Consequently, the position of the substrate W within the casing 2 is suitably controllable when the lid 3 is detached from the casing 2.

When the lid 3 moves backward from the opening A, the contact parts 33 continuously contact the substrate W until the lid holder 23 separates from the substrate W. Accordingly, the substrate separating mechanism 31 ensures separation of the substrate W from the lid holder 23.

The springs 32 are elastically deformed and restored, thereby moving the contact parts 33 forward/backward suitably relative to the lid holder 23. Such the springs 32 of the substrate separating mechanism 31 achieves the simplified configuration of the substrate separating mechanism 31.

The springs 32 are compressively deformed with use of forward movement of the lid 3 to the opening A. As a result, the substrate separating mechanism 31 needs no separated mechanism that deforms the springs 32 elastically. In other words, the much simplified configuration of the substrate separating mechanism 31 is obtainable.

Moreover, when the lid 3 moves forward to the opening A, the substrate W within the casing 2 contact the contact parts 33 to move the contact parts 33 backward relative to the lid holder 23. In other words, the contact parts 33 move backward relative to the lid holder 23 with use of the substrate W within the casing 2. Accordingly, the substrate container 1 needs no separated element to move the contact parts 33 backward relative to the lid holder 23. That is, the configuration of the substrate container 1 is also simplified.

The springs 32 causes the substrate W to press the casing holder 16 while the lid 3 is attached to the casing 2. This allows the casing holder 16 and the lid holder 23 to nip the substrate W at a suitable strength.

When the lid holder 23 is made of an elastic resin, the lid holder 23 allows accurate holding of the substrate W.

The casing 2 includes therein the casing holder 16. Accordingly, the casing holder 16 and the lid holder 23 allow suitable holding of the substrate W while the lid 3 is attached to the casing 2.

In the present embodiment, there is no difference in level of the substrate W between when the rack 11 holds the substrate W and when the holders 16 and 23 hold the substrate W. In other words, there is no difference in level of the substrate W within the substrate container 1 between when the lid 3 is attached to the casing 2 and when the lid 3 is detached from the casing 2. Accordingly, the substrate container 1 is of a FOUP (Front Opening Unified Pod) type. As noted above, the substrate separating mechanism 31 is suitably applicable to a substrate container 1 of a FOUP type.

Moreover, the substrate container 1 is suitably placed on the load port devices 420, 421, and 422.

The substrate treating apparatus 41 allows treatment, such as liquid treating or heat treating, to the substrates W storable in the substrate container 1.

EMBODIMENT 2

The following describes Embodiment 2 of the present invention with reference to drawings. Like numerals are used to identify like components which are the same as in Embodiment 1 and will not particularly be described.

1. Configuration of Substrate Container

Figure 6A:
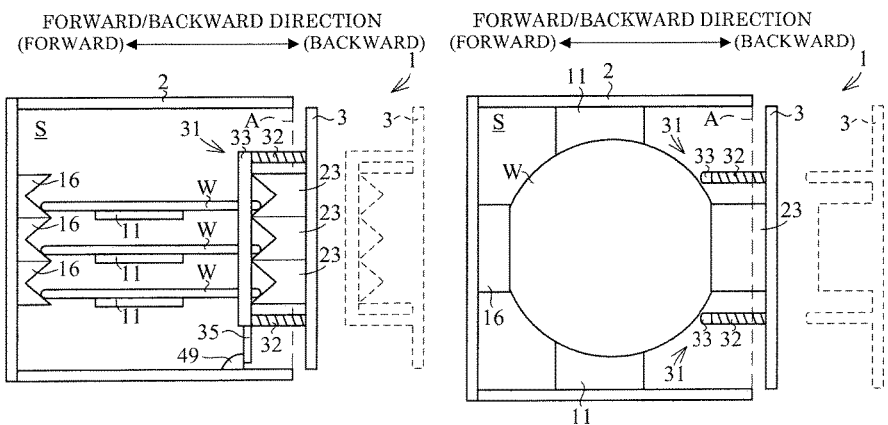
FIGS. 6(a) to 6(c) are each a side view and a plan view of an interior of the substrate container when the lid is attached/detached to/from the casing.
Figure 6B:
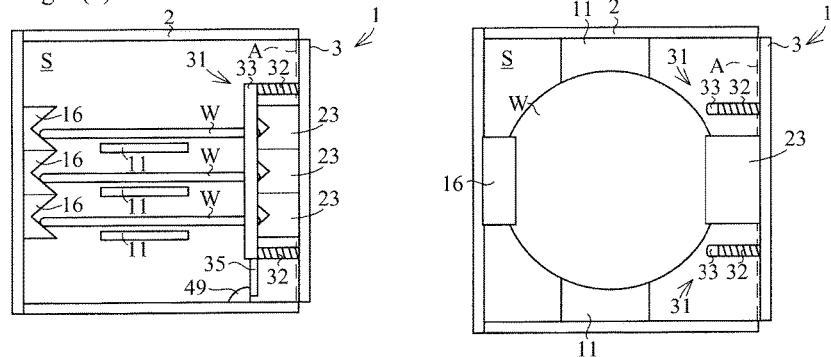
Figure 6C:
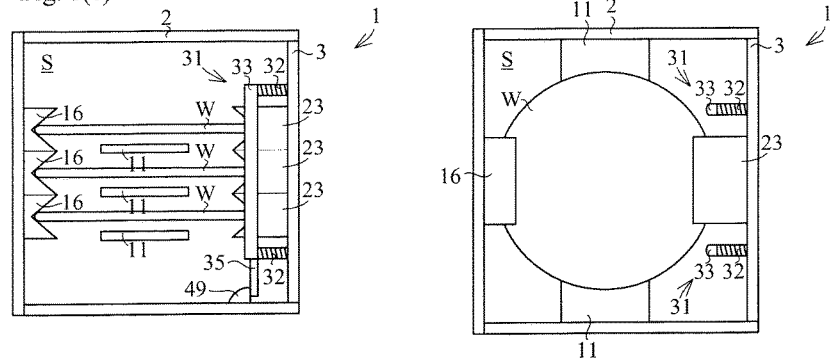

Reference is made to FIGS. 6(a) to 6(c). FIGS. 6(a) to 6(c) each illustrate a side view on the left thereof and a plan view on the right thereof. In Embodiment 2, when the lid 3 faces to the opening A, the downward slope 17a of the casing holder 16a and the downward slope 24a of the lid holder 23a are each disposed at a level where they allow contact to the end of the substrate W placed on the rack 11a substantially horizontally. Moreover, the deepest part 17b of casing holder 16a and the deepest part 24b of the lid holder 23a are each disposed at a level where they allow contact to the end of the substrate W that have moved upward from the rack 11.

In Embodiment 2, the substrate separating mechanism 31 includes a connecting board 35 in addition to the springs 32 and the contact parts 33. The connecting board 35 is connected to a lower end face of the contact parts 33. The connecting board 35 extends downwardly from the contact parts 33, and moves integrally with the contact parts 33 in the vertical direction.

In Embodiment 2, the substrate container 1 further includes a stopper 49. The stopper 49 is fixed on the casing 2. When the connecting board 35 moves to a position denoted by solid lines in FIG. 6(a), the stopper 49 contacts the connecting board 35. This causes the stopper 49 to restrict forward movement of the contact parts 33 from a given position denoted by solid lines in FIG. 6(a). That is, the given position corresponds to a position where the contact parts 33 are able to enter deepest in the forward direction within the casing 2, and thus corresponds to a position of the contact parts 33 defined by the stopper 49. In the present embodiment, the given position is set adjacent to the end of the substrate W held with the lid holder 23 while the lid 3 is attached to the casing 2. When the lid 3 is attached to the casing 2 and the contact parts 33 are disposed at the given position, the contact parts 33 are adjacent to the end of the substrate W by a slight gap.

2. Example of Operation

2.1. Condition of Lid 3 Detached from Casing 2

Reference is made to FIG. 6(a). For instance, the lid 3 is disposed at a position denoted dotted lines. The substrate W is placed on the rack 11. The downward slope 17a of the casing holder 16 contacts a rear end of the substrate W.

2.2. Example of Operation when Lid 3 is Attached to Casing 2

Reference is made to FIG. 6(a). When the lid 3 moves forward from the position denoted by the dotted lines, the lid holder 23 and the substrate separating mechanism 31 move forward integrally with the lid 3.

When the lid 3 reaches the position denoted by solid lines, the contact parts 33 move to the given position, and the stopper 49 contacts the substrate separating mechanism 31. At this time, the lid 3 is not attached to the casing 2. The contact parts 33 may contact the substrate W within the casing 2, but otherwise is applicable. FIG. 6(a) illustrates when no contact part 33 contacts the substrate W.

When the lid 3 is moved forward to the position denoted by the solid lines, the downward slope 24a of the lid holder 23 contacts a front end of the substrate W.

Reference is made to FIG. 6(b). When the lid 3 further moves forward, the lid holder 23 moves forward integrally with the lid 3, whereas the contact parts 33 do not move forward. The contact parts 33 remain at the position while contacting the stopper 49. This allows the contact parts 33 to approach the lid 3 and move backward relative to the lid holder 23. The contact parts 33 approach the lid 3 (i.e., the contact parts 33 move backward relative to the lid holder 23), whereby the springs 32 compressively deform. The springs 32 press the contact parts 33 forward.

The lid holder 23 moves forward integrally with the lid 3, thereby pressing the substrate W forward. The front end of the substrate W slides up the downward slope 17a of the casing holder 16, whereas the rear end of the substrate W slides up the downward slope 24a of the lid holder 23. This causes the substrate W to move upward and forward. With the upward movement of the substrate W, the substrate W upward from the rack 11 (i.e., the substrate W floats above the rack 11). With the forward movement of the substrate W, the substrate W moves away from the contact parts 33.

Reference is made to FIG. 6(c). The lid 3 moves forward to the opening A to be attached to the casing 2. The front end of the substrate W arrives at the deepest part 17b, and the rear end of the substrate W arrives at the deepest part 24b. This causes the lid holder 23 and the casing holder 16 to nip the substrate W while the rack 11 does not contact the undersurface of the substrate W. At this time, the contact parts 33 face the end of the substrate W by a slight gap.

2.3. Example of Operation when Lid 3 is Detached from Casing 2

Reference is made to FIGS. 6(c) and 6(b). When the lid 3 moves backward from the opening A, the lid holder 23 moves backward integrally with the lid 3. In contrast to this, the springs 32 are restored (extend), whereby the contact parts 33 remain at the given position without moving backward integrally with the lid 3 while contacting the stopper 49. That is, the contact parts 33 move away from the lid 3 and forward relative to the lid holder 23.

When the lid 3 moves backward from the opening A, the substrate W either separates or does not separate from the lid holder 23 by itself.

Upon the former, the substrate W separates from the lid holder 23 without contacting the contact parts 33. Specifically, when the lid 3 moves backward from the opening A as in FIG. 6(b), the substrate W disengages from the deepest part 24b by its own weight, and then slides downward on the downward slope 24a by its own weight. Moreover, as in FIG. 6(a), the substrate W is placed on the rack 11 by itself, and separates from the downward slope 24a of the lid holder 23 by itself. During such operation, the substrate W does not contact the contact parts 33.

For the latter, when the lid 3 moves backward from the opening A, the substrate W does not sometimes disengage from the deepest part 24b by itself or the substrate W does not sometimes slide downward on the downward slope 24a. The substrate W not separating from the lid holder 23 by itself may possibly move integrally with the lid holder 23 moving backward. For instance, the substrate W may be pulled backward with the lid holder 23.

Figure 7:
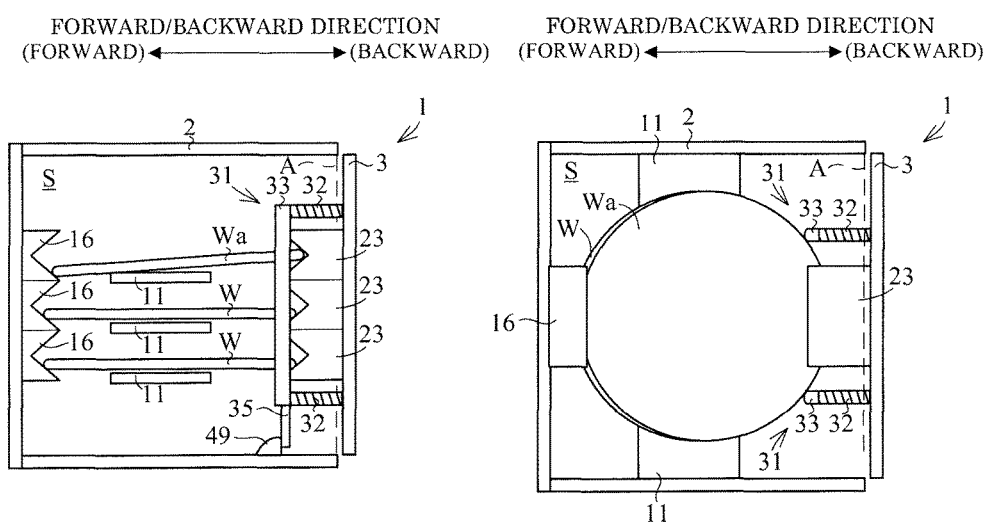
FIG. 7 is a side view and a plan view of the interior of the substrate container when the lid moves backward from the opening.

Reference is made to FIG. 7. FIG. 7 illustrates a substrate Wa that does not separate from the lid holder 23 by itself when the lid 3 moves backward from the opening A. As illustrated, even when the lid 3 moves backward from the opening A, the end of the substrate Wa remains held with the deepest part 24b, and thus does not disengage from the deepest part 24b. The substrate Wa is moved backward integrally with the lid holder 23.

As mentioned above, while the lid 3 is attached to the casing 2, the substrate W is nipped between the holders 16 and 23, the contact parts 33 remain at the given position with the springs 32 and the stopper 49, and the substrate W is disposed adjacent to the contact parts 33 by a slight gap. After the lid 3 starts to move backward from the opening A, the restoration of the spring 32 causes the contact parts 33 to remain at the given position adjacent to the end of the substrate W. Accordingly, even when the substrate Wa is moved backward integrally with the lid holder 23 while attached to the lid holder 23, the substrate Wa rapidly (or immediately) contacts the contact parts 33. Contact of the substrate Wa to the contact parts 33 causes no more backward movement of the substrate Wa. That is because the contact parts 33 prevent the backward movement of the substrate Wa. The lid holder 23 moves further backward, whereby the substrate Wa remaining with the contact parts 33 separates from the lid holder 23. More specifically, the substrate Wa disengages from the deepest part 24b, slides downward on the downward slope 24a to the rack 11, and separates from the downward slope 24a.

When the contact parts 33 separate the substrate Wa from the lid holder 23, the contacts parts 33 are disposed at the given position. Accordingly, the substrate Wa having separated from the lid holder 23 is disposed at a position adjacent to the position of the substrate Wa while the lid 3 is attached to the casing 2. As noted above, the substrate Wa that does not separate from the lid holder 23 by itself upon detachment of the lid 3 from the casing 2 is able to be disposed within a suitable area after the lid 3 is detached from the casing 2. Even when two or more substrates W do not separate from the lid holder 23 by itself upon detachment of the lid 3 from the casing 2, all the substrates W within the casing 2 are disposed at the suitably controlled position after the lid 3 is detached from the casing 2.

3. Effect of Embodiment 2

When the lid 3 moves forward to the opening A, the contact parts 33 move backward relative to the lid holder 23. Accordingly, the substrate separating mechanism 31 does not prevent the lid holder 23 from holding the substrate W. Consequently, when the lid 3 is attached to the casing 2, the lid holder 23 suitably holds the end of the substrate W within the casing 3.

When the lid 3 moves backward from the opening A, the contact parts 33 move forward relative to the lid holder 23, whereby the substrate separating mechanism 31 separates the substrate W from the lid holder 23. This allows the substrate W to remain at the suitable position or area when the lid 3 is detached from the casing 2. As noted above, the substrates W within the casing 2 are disposed at the suitably controlled position when the lid 3 is detached from the casing 2.

Moreover, since the substrate separating mechanism 31 does not contact the substrate W having separated from the lid holder 23 by itself when the lid 3 moves backward from the opening A, the substrates W are protectable more suitably.

The substrate container 1 includes the stopper 49. This suitably prevents the contact parts 33 from moving forward over the given position. Consequently, the substrates W are protectable more suitably.

When the lid 3 moves backward from the opening A, restriction with the stopper 49 and restoration of the springs 32 cause the contact parts 33 to remain at the given position. This allows the substrate W to be prevented suitably from moving forward from the given position.

Here, the given position is set adjacent to the end of the substrate W held with the lid holder 23 when the lid 3 is attached to the casing 2. Accordingly, the contact parts 33 do not contact the substrate W while the lid 3 is attached to the casing 2. Consequently, this allows suitable protection of the substrate W. Moreover, the substrate W while the lid 3 is detached from the casing 2 may be disposed at the same position as or adjacent to a position of the substrate W while the lid 3 is attached to the casing 2.

In the present embodiments, the position of the substrate W differs in level between when the rack 11 holds the substrate W and when the holders 16 and 23 hold the substrate W. As a result, the substrate container 1 is one type of a MAC (Multi Application Carrier). As noted above, the substrate separating mechanism 31 is suitably applicable to the substrate container 1 of a MAC type.

The present invention is not limited to the foregoing examples, but may be modified as follows.

(1) The configuration of the substrate separating mechanism 31 is variable appropriately.

Figure 8A:
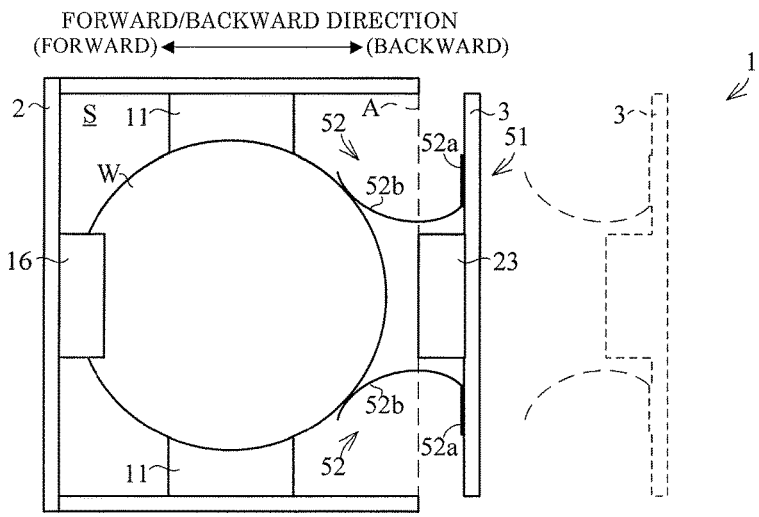
FIGS. 8(a) to 8(c) are each a plan view of the interior of the substrate container when the lid is attached/detached to/from the casing.
Figure 8B:
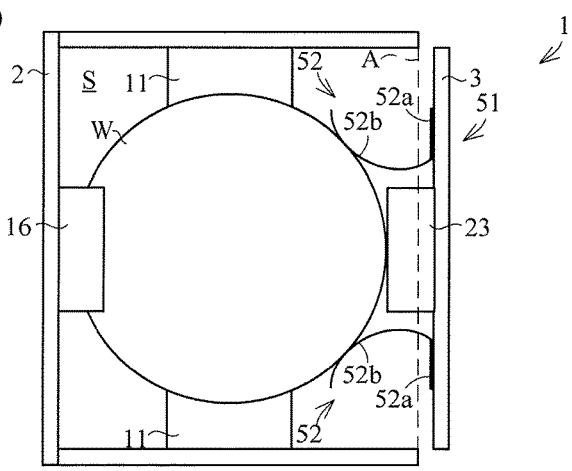
Figure 8C:
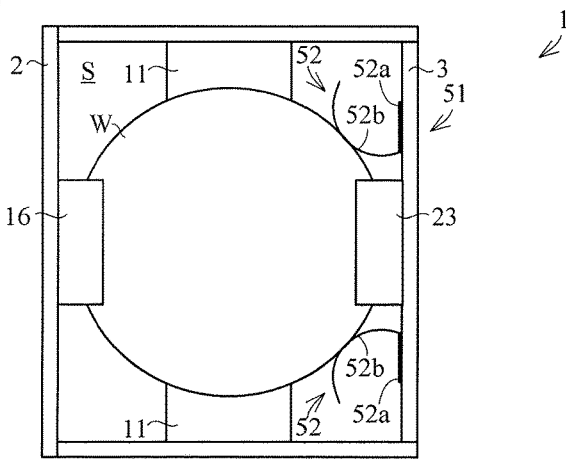

Reference is made to FIGS. 8(*a*), 8(*b*), and 8(*c*). As illustrated, the substrate container 1 includes a substrate separating mechanism 51. The substrate separating mechanism 51 includes a plurality of springs 52. The springs 52 are each, for example, a cantilever spring. The springs 52 each include a proximal end 52a and a contact part 52b. The proximal end 52a is fixed on the lid 3. One of the proximal ends 52a of the springs 52 is fixed on the right of the lid holder 23, whereas the other of the proximal ends 52a of the springs 52 is fixed on the left of the lid holder 23. The springs 52 deflect (or warp or bend), thereby approaching the lid 3, and causing the contact parts 52b to move away from the lid 3.

The contact parts 52b directly contact the substrate W. The contact parts 52b may contact a plurality of substrates W collectively, or contact only one substrate W. In the latter, a plurality of springs 52 is disposed in the vertical direction. The springs 52 are one example of the elastic member in the present invention.

In this modification, when the lid 3 moves forward to the opening A, the contact parts 52b move backward relative to the lid holder 23 and the lid holder 23 holds the end of the substrate W. Moreover, when the lid 3 moves backward from the opening A, the contact parts 52b move forward relative to the lid holder 23, and the substrate separating mechanism 51 separates the substrate W from the lid holder 23. Consequently, this modification produces the same effect as that of Embodiments 1 and 2. In addition, the contact parts 52b are each one part of the spring 52 and thus the substrate separating mechanism 51 is able to be much simplified in its configuration.

(2) The given position defined with the stopper 49 is variable appropriately. For instance, a position to be in contact with the end of the substrate W that is held with the lid holder 23 while the lid 3 is attached to the casing 2 may be set as the given position. In this modification, when the lid 3 moves backward from the opening A, the substrate separating mechanism 31 strictly prevents backward movement of the substrate W in the casing 2. As a result, the substrate W is even unable to move backward slightly if the lid 3 moves backward from the opening A. Consequently, the position of the substrate W after the lid 3 is detached from the casing 2 is able to conform to the position of the substrate W while the lid 3 is attached to the casing 2.

(3) In Embodiment 1 mentioned above, the contact parts 33 contact the substrate W even after the substrate W separates from the lid holder 23. However, this is not limitative. That is, a period of time when the contact parts 33 contact the substrate W is variable appropriately as long as the substrate separating mechanism 31 allows separation of the substrate W from the lid holder 23. For instance, the contact parts 33 may also separate from the substrate W when the substrate W separates from the lid holder 23.

(4) In Embodiment 1 mentioned above, contact parts 33 contact the substrate W before the lid holder 23 contacts the substrate W when the lid 3 moves forward to the opening A. However, this is not limitative. That is, the contact parts 33 may contact the substrate W simultaneously with or after contact of the lid holder 23 to the substrate W. Also in Embodiment 2, a time anteroposterior relation is variable appropriately between contact of the contact parts 33 to the substrate W and contact of the lid holder 23 to the substrate W.

(5) In the embodiments and the modification mentioned above, the substrate separating mechanisms 31 and 51 (contact parts 33, 52b) are disposed on both sides of the lid holder 23. However, this is not limitative. That is, the lid holder 23 may be disposed on both sides of the substrate separating mechanisms 31 and 51 (contact parts 33 and 52b).

(6) In the embodiments mentioned above, a plurality of casing holders 16 is formed integrally. However, this is not limitative. For instance, the casing holders 16 may be separated one another. The lid holder 23 is variable in configuration in the same manner as above.

(7) In the embodiments mentioned above, the casing holder 16 contacts the substrate W while the lid 3 is detached from the casing 2. However, this is not limitative. That is, the casing holder 16 need not contact the substrate W while the lid 3 is detached from the casing 2.

(8) In the embodiments mentioned above, the casing holder 16 is fixed on the casing 2. However, this is not limitative. That is, the casing holder 16 is movable relative to the casing 2. Similarly, the lid holder 23 is fixed on the lid 3. However, this is not limitative. The lid holder 23 is movable relative to the lid 3.

(9) In the embodiments mentioned above, the casing holder 16 and the lid holder 23 are variable in shape where appropriate. For instance, the downward slope 17a or the upward slope 17c may be omitted when the casing holder 16 contacts the substrate W only at the deepest part 17b as in Embodiment 1. Likewise, the downward slope 24a or the upward slope 24c may be omitted when the lid holder 23 contacts the substrate W only at the deepest part 24b.

(10) In the embodiments mentioned above, a plurality of casing holders 16 is disposed in a row in the vertical direction. However, this is not limitative. That is, the casing holders 16 may be disposed in a plurality of rows in the vertical direction. Moreover, the casing holders 16 may be disposed in a staggered manner in the vertical direction. Such arrangement variation is similarly applicable to the lid holder 23.

(11) In the embodiments mentioned above, the substrate container 1 may further includes a shield that covers the substrate separating mechanisms 31 and 51 partially. Alternatively, the substrate container 1 may further include a shield that keeps the space around the substrate W in the casing 2 clean. Examples of the shield include a bellows that covers the springs 32 and a division wall that covers the proximal end 52a of the spring 52. This achieves prevention of particles from adhering to the substrate W, the particles being generated by the substrate separating mechanisms 31 and 51.

(12) In the embodiments mentioned above, the load port devices 420, 421, and 422 each include one mount table 44. However, this is not limitative. That is, the load port devices may each include a plurality of mount tables. Moreover, in the embodiments mentioned above, the load port devices 420, 421, and 422 each allow one substrate container 1 to be placed thereon. However, this is not limitative. That is, the load port devices may each allow a plurality of substrate containers 1 to be placed thereon.

(13) The present embodiments and the modifications in the above (1) to (12) are variable appropriately by replacing or combining the unit of the present embodiments or the modifications with the other thereof.

REFERENCE SIGNS LIST

1 . . . substrate container
2 . . . casing
3 . . . lid
3b . . . rear face
11a, 11b, 11c, 11 . . . rack
16a, 16b, 16c, 16 . . . casing holder
23a, 23b, 23c, 23 . . . lid holder
31, 51 . . . substrate separating mechanism
32, 52 . . . spring (elastic member)
33, 52b . . . contact part
41 . . . substrate treating apparatus
42 . . . load port section
44 . . . mount table
45 . . . open/close mechanism
47 . . . transport mechanism
48 . . . treating unit
A . . . opening
420, 421, 422 . . . load port device
W, Wa . . . substrate

The invention claimed is:

1. A substrate container, comprising:
a casing with an opening on a front face of the casing that accommodates substrates therein;
a rack inside the casing on which the substrates are disposed in a substantially horizontal attitude;
a lid that is attached to the casing and detached from the casing and opens and closes the opening;
a lid holder attached to a rear face of the lid that holds ends of the substrates;
a substrate separating mechanism attached to the rear face of the lid that separates from the lid holder the substrates held with the lid holder, and including a contact part that directly contacts the substrates, and
a stopper provided in the casing for restricting forward movement of the contact part from a given position within the casing through contact to the substrate separating mechanism,
wherein
the contact part is movable relative to the lid holder,
the lid moves forward to the opening, and the contact part moves backward relative to the lid holder, whereby the lid holder holds the ends of the substrates, and the lid moves backward from the opening, and the contact part moves forward relative to the lid holder, whereby the substrate separating mechanism separates the substrates from the lid holder.

2. The substrate container according to claim 1, wherein the contact part moves close to the lid, whereby the contact part moves backward relative to the lid holder, and the contact part moves away from the lid, whereby the contact part moves forward relative to the lid holder.

3. The substrate container according to claim 2, wherein the contact part continuously contacts the substrates until at least the substrates separate from the lid holder when the lid moves backward from the opening.

4. The substrate container according to claim 1, wherein the substrate separating mechanism comprises an elastic member that moves the contact part, elastic deformation of the elastic member causes the contact part to move backward relative to the lid holder, and restoration of the elastic member causes the contact part to move forward relative to the lid holder.

5. The substrate container according to claim 1, wherein the substrates within the casing move the contact part backward relative to the lid holder through contact to the contact part when the lid moves forward to the opening.

6. The substrate container according to claim 1, wherein the given position is set as a position where the stopper contacts the ends of the substrates held with the lid holder when the lid is attached to the casing, or is set adjacent to the ends of the substrates held with the lid holder when the lid is attached to the casing.

7. The substrate container according to claim 1, further comprising:

a casing holder provided in the casing for holding the ends of the substrates, wherein the casing holder and the lid holder nip the ends of the substrates.

8. The substrate container according to claim 7, wherein the ends of the substrates are nipped with the casing holder and the lid holder, whereby the substrates are moved upward from the rack, and when the lid holder moves backward from the opening and the contact part moves forward relative to the lid holder, the substrate separating mechanism separates the substrates from the lid holder and moves the substrates downward from the lid holder to the rack.

9. A load port apparatus, comprising:

a mount table;

a substrate container which is placeable on the mount table; and an open and close mechanism that opens and closes a lid of the substrate container on the mount table, wherein the substrate container comprises:

a casing with an opening on a front face of the casing that accommodates substrates therein;

a rack inside the casing on which the substrates are disposed in a substantially horizontal attitude;

a lid that is attached to the casing and detached from the casing and opens and closes the opening;

a lid holder attached to a rear face of the lid that holds ends of the substrates;

a substrate separating mechanism attached to the rear face of the lid that separates from the lid holder the substrates held with the lid holder, and including a contact part that directly contacts the substrates, and a stopper provided in the casing for restricting forward movement of the contact part from a given position within the casing through contact to the substrate separating mechanism, and wherein the contact part is movable relative to the lid holder, the lid moves forward to the opening, and the contact part moves backward relative to the lid holder, whereby the lid holder holds the ends of the substrates, and the lid moves backward from the opening, and the contact part moves forward relative to the lid holder, whereby the substrate separating mechanism separates the substrates from the lid holder.

10. A substrate treating apparatus, comprising:

a mount table;

a substrate container which is placeable on the mount table; and an open and close mechanism that opens and closes a lid of the substrate container on the mount table;

a treating unit that treats substrates; and a transport mechanism that transports the substrates from the substrate container on the mount table to the treating unit, wherein the substrate container comprises:

a casing with an opening on a front face of the casing that accommodates substrates therein;

a rack inside the casing on which the substrates are disposed in a substantially horizontal attitude;

a lid that is attached to the casing and detached from the casing and opens and closes the opening;

a lid holder attached to a rear face of the lid that holds ends of the substrates;

a substrate separating mechanism attached to the rear face of the lid that separates from the lid holder the substrates held with the lid holder, and including a contact part that directly contacts the substrates, and a stopper provided in the casing for restricting forward movement of the contact part from a given position within the casing through contact to the substrate separating mechanism, and wherein the substrates, the contact part is movable relative to the lid holder, the lid moves forward to the opening, and the contact part moves backward relative to the lid holder, whereby the lid holder holds the ends of the substrates, and the lid moves backward from the opening, and the contact part moves forward relative to the lid holder, whereby the substrate separating mechanism separates the substrates from the lid holder.

* * * * *